United States Patent [19]
Stich

[11] 4,378,580
[45] Mar. 29, 1983

[54] CONDUCTION LIMIT PROTECTION ARRANGEMENT FOR POWER TRANSISTOR SWITCH

[75] Inventor: Frederick A. Stich, Milwaukee, Wis.

[73] Assignee: Allis-Chalmers Corporation, Milwaukee, Wis.

[21] Appl. No.: 320,415

[22] Filed: Nov. 12, 1981

Related U.S. Application Data

[63] Continuation of Ser. No. 122,437, Feb. 2, 1980, abandoned, which is a continuation-in-part of Ser. No. 970,469, Dec. 18, 1978, abandoned.

[51] Int. Cl.³ .............................................. H02H 7/20
[52] U.S. Cl. ..................................... 361/91; 323/284; 323/288; 307/297; 330/207 P; 330/298; 361/86; 361/18
[58] Field of Search ...................... 323/279, 284, 288; 330/207 P, 298; 361/91, 18, 89, 101, 86–88, 93, 90; 307/297

[56] References Cited

U.S. PATENT DOCUMENTS

| | | | |
|---|---|---|---|
| 3,383,561 | 5/1968 | Thiele | 361/91 X |
| 3,449,598 | 6/1969 | Wright | 361/91 |
| 3,573,555 | 4/1971 | Lipnitz | 361/94 |
| 3,777,240 | 12/1973 | Neill | 361/106 X |
| 3,855,520 | 12/1974 | Stich | 361/91 X |
| 3,868,554 | 2/1975 | Konard | 361/103 X |
| 3,946,280 | 3/1976 | Quist | 361/94 X |
| 4,016,459 | 4/1977 | Boehringer | 323/284 X |
| 4,074,334 | 2/1978 | D'Arrigo et al. | 361/56 |

Primary Examiner—Patrick R. Salce
Attorney, Agent, or Firm—Lee H. Kaiser

[57] ABSTRACT

A conduction limit protective arrangement for a power transistor switch regulated by a train of control pulses is disclosed which automatically changes the conduction limit as a function of the voltage, current, and temperature conditions to which the switch is subjected so that it is within its safe operating area limits at all times, thereby permitting the switch to carry maximum current while being fully protected at all times.

21 Claims, 4 Drawing Figures

CONDUCTION LIMIT PROTECTION ARRANGEMENT FOR POWER TRANSISTOR SWITCH

This is a continuation, of application Ser. No. 122,437, filed Feb. 2, 1980 now abandoned, which was a continuation-in-part of application Ser. No. 970,469 filed Dec. 18, 1978, now abandoned.

BACKGROUND OF THE INVENTION

This invention relates to the protection of power transistor switches during overload conditions.

Variable duty cycle controls are known wherein a power transistor switch in series with an electrical power source and a load is periodically turned on and off to regulate the average voltage supplied to the load. Change in load in such variable duty cycle control may draw more current from the transistor switch and cause it to experience abnormally high "on" voltages and move further into the active region with resultant increased voltage drop across the switch and increased heat losses that may damage the transistor switch and cause it to fail. Protection circuits, such as disclosed in my U.S. Pat. No. 3,855,520, are known for preventing failure of a transistor power switch utilizing conduction limit means responsive to the voltage across the power switch exceeding a predetermined magnitude for reducing the duty cycle of the control pulses that turn the power transistor switch on and off. Such conduction limit protective circuit is based upon the fact that the voltage drop across the transistor power switch increases rapidly at currents in excess of design limits because the base drive current is not sufficient to maintain low on-voltage at higher current, and such conduction limit protective circuit utilizes a voltage threshold detector to sense the collector-to-emitter voltage drop ($V_{CE}$) across the power transistor switch and turn it off at high $V_{CE}$ values. Such conduction limit protective circuit tends to latch the power switch in the off state and consequently requires means to turn the transistor power switch on again. The conduction limit circuit disclosed in my U.S. Pat. No. 3,855,520 provides a narrow "guard" pulse at the beginning of each conduction period to defeat the conduction limit circuit for a short interval and thus permit the power transistor switch to again turn on. The guard pulse must be of sufficient width to assure turning on of the slowest of the paralleled transistors which comprise the power switch under rated current conditions. During the guard pulse there is no protection for the power transistors. Further, the width of the guard pulse and the voltage threshold "triggering" level do not adapt to the changing conditions to which the power transistor switch may be subjected such as variations in temperature, switching time, or voltage.

SUMMARY OF THE INVENTION

The conduction limit arrangement of the present invention provides continuous power transistor switch protection that is tailored to the "safe operating area" of the power transistor switch and assures safe and flexible operation at any $V_{CE}$ value within the rating of the transistor. For example, safe operating area data is shown in the following table for a power switch using paralleled BUX20 transistors designed so that peak current does not exceed fifty amperes per transistor at 65° C. heatsink temperature:

| $V_{CE}$ (volts) | $t_p$ (u sec) | $t_{RC}$ (u sec) |
|---|---|---|
| 3.75 | | 311 |
| 6.75 | 10,000 | 151 |
| 17.25 | 1,000 | 54 |
| 26.25 | 500 | 35 |
| 37.50 | 100 | 24 |
| 56.25 | 50 | 16 |
| 90.00 | 10 | 10 |

The first column illustrates the range of $V_{CE}$ voltages that may be experienced by the power transistor switch. The second column shows the length of time, $t_p$, that the transistor can sustain 50 amperes and the corresponding $V_{CE}$ voltage shown in column 1 without damage, the shortest time being at the highest $V_{CE}$. The present invention integrates $V_{CE}$ across the power transistor switch by means of an RC timing circuit, and the output of the RC timing circuit is an input to a voltage threshold detector set to switch at a predetermined "triggering" level to turn off the power switch. The third column of the above table shows the length of time ($t_{RC}$) required for such RC timing circuit to reach the predetermined triggering level (1.62 volts in the specific example) for the $V_{CE}$ value shown in column 1 of the table. The conduction limit protective circuit of the invention only reduces the duty cycle of the control pulse applied to a power transistor switch subjected to a $V_{CE}$ voltage shown in column 1 after the corresponding time $t_{RC}$ shown in column 3. In contrast, prior art conduction limit protective circuits would have used a 25 microsecond guard pulse for this power switch, and such prior circuit using a 25 microsecond guard pulse would have been too sensitive at low $V_{CE}$ values and not fast enough at high $V_{CE}$ values.

Accordingly it is an object of the invention to provide a conduction limit protective arrangement for a power switch which maintains the power switch within its safe operating area limits at all times and automatically changes such limits in accordance with the operating conditions to which the power switch is subjected, thereby permitting the power switch to carry maximum current while being fully protected at all times.

A conduction limit protective circuit in accordance with the present invention has an RC integrator timing circuit including a resistance in series with a timing capacitor connected to receive, as an input, the voltage drop across a power transistor switch for deriving a potential which increases in magnitude as a function of time, threshold detector means for sensing when said voltage potential reaches a predetermined magnitude and for providing an output signal in response thereto, means for removing the control pulse from the power transistor switch in response to the output signal from the threshold detector means, whereby conduction by the transistor power switch is limited and it is turned off before damage can occur when it experiences abnormally high on-voltages and moves further into the active region, and means for discharging the capacitor of the RC timing circuit to a predetermined level subsequent to the termination of each control pulse so that timing begins from zero.

DETAILED DESCRIPTION

Figure 1:
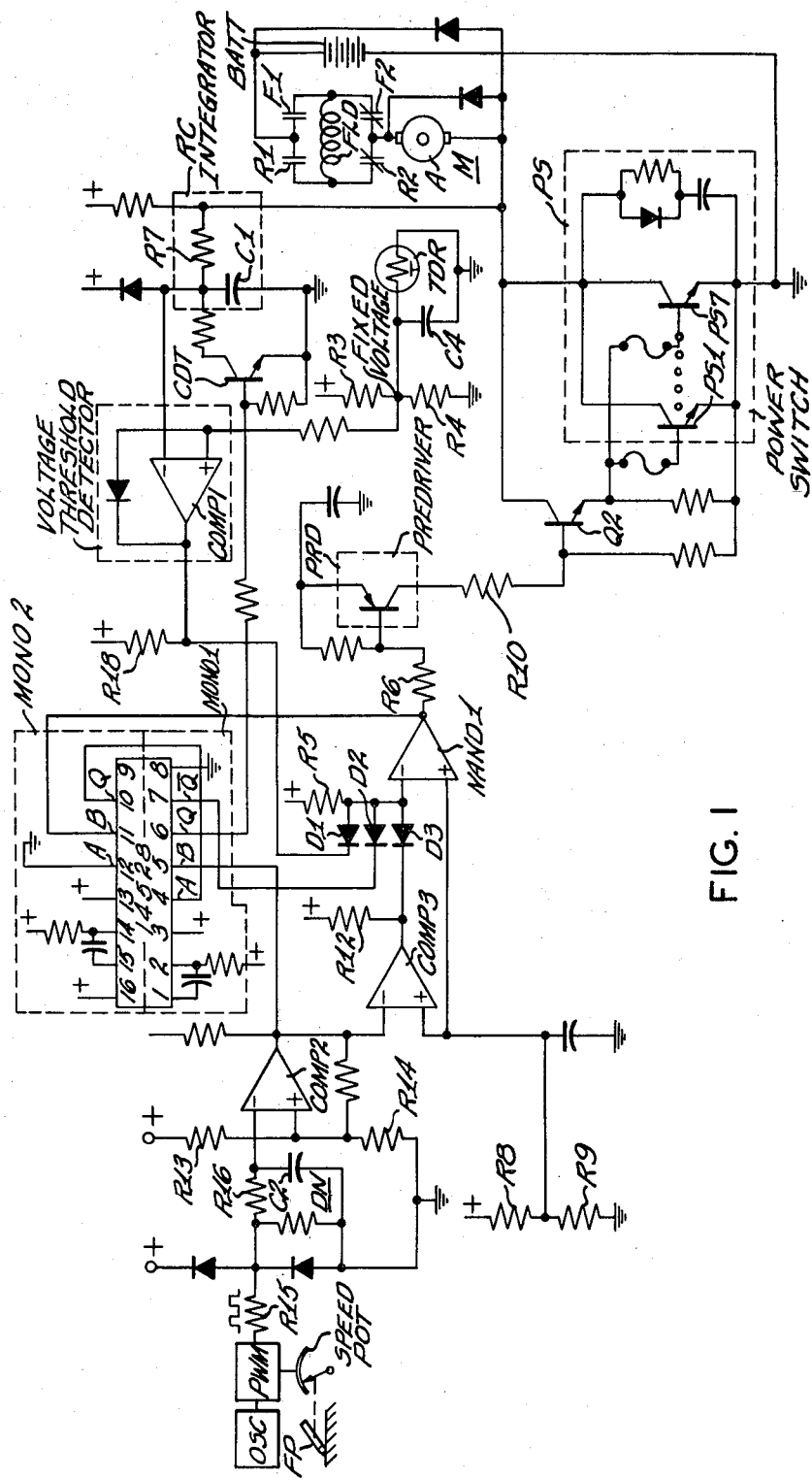
FIG. 1 is a schematic circuit diagram of a pulse width modulation control embodying the invention.
Figure 2:
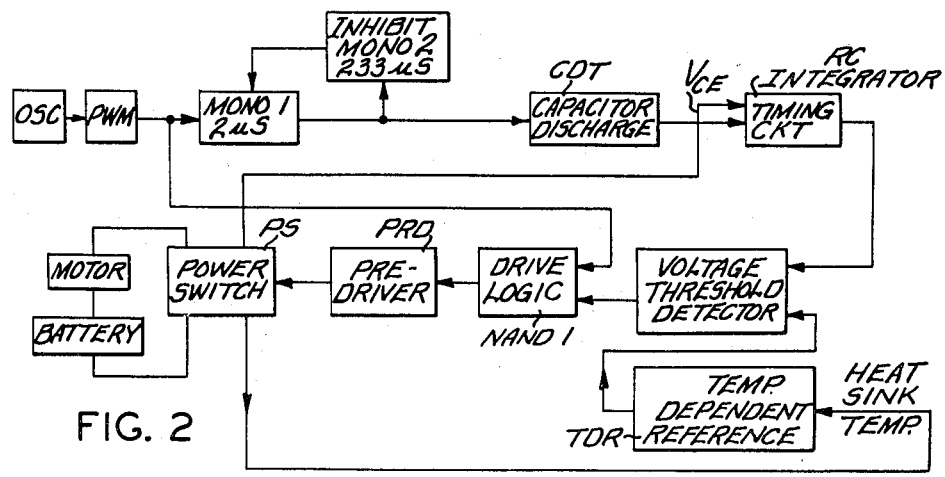
FIG. 2 is a block diagram of the circuit of FIG. 1.

FIG. 1 illustrates a pulse width modulation system incorporating a preferred embodiment of the invention which controls a DC series traction motor M having an armature A and field winding FLD for driving the wheels of a fork lift truck (not shown). Armature A may be connected in series with field winding FLD and a power transistor switch PS across the terminals of a battery BATT through the contacts F1 of a forward contactor and R2 of a reverse contactor to drive motor M in one direction to propel the lift truck forward or through the contacts R1 of the reverse contactor and F2 of the forward contactor to reverse motor M and propel the lift truck to the rear. Power switch PS may comprise a plurality of paralleled bipolar power transistors PS1-PS7 connected in a Darlington arrangement with a driver transistor Q2. Motor M is energized by unidirectional pulses of current from battery BATT conducted by power switch PS, and the speed of motor M is adjusted by a pulse width modulation control PWM shown only in block form which receives a succession of triggering pulses from an oscillator OSC and varies the width thereof in accordance with the position of the wiper of a speed potentiometer SPEED POT which is selectively controlled by a foot pedal FP on the lift truck. Control PWM supplies variable width base drive current pulses to driver transistor Q2 of sufficient magnitude so that Q2 operates in saturation while PS1-PS7 are on and experience low voltage drop, and control PWM regulates the duty cycle of such pulses in accordance with the position of speed potentiometer SPEED POT to thereby vary the average voltage applied to motor M.

The emitter of power switch PS is grounded, and the collector-to-emitter voltage $V_{CE}$ across power switch PS is applied to an RC timing circuit integrator comprising a resistance R7 in series with a capacitor C1 having one electrode grounded. The voltage across capacitor C1 is coupled to the inverting input of a voltage threshold detector operational amplifier, or comparator COMP 1 whose noninverting input receives a fixed threshold voltage (for example 1.62 volts) derived at the junction of two resistances R3 and R4 connected in series as a voltage divider between a constant voltage source (preferably 12 volts) designed + and ground. When transistors PS1-PS7 of power switch PS are conducting during normal current levels, their collector-to-emitter voltage $V_{CE}$ is low with the result that the voltage across capacitor C1 is low and the output of threshold detector COMP 1 is positive (binary 1) because of the fixed positive binary 1 (or logic 1) voltage on its noninverting input. The output from comparator COMP 1 is coupled through a diode D1 to the inverting input of a comparator NAND 1 connected as a NAND logic gate. The inverting input of NAND 1 also receives a second input through a diode D2 from the $\overline{Q}$ output of a two microsecond monostable multivibrator MONO 1 and a third input through a diode D3 from the output of a comparator COMP 3 which re-inverts the variable width PWM control pulses.

The binary 1 voltage output from comparator COMP 1 is blocked by diode D1. When neither D1, D2 or D3 is conducting, a positive binary 1 voltage from voltage source + is coupled through a resistance R5 to the inverting input of logic gate NAND 1 to thereby maintain negative binary 0 voltage on its output. The output from gate NAND 1 is coupled through a resistance R6 to the base of a type PNP predriver transistor amplifier PRD, and the binary 0 output from NAND 1 maintains PRD in conduction.

When the paralleled power transistors PS1-PS7 experience abnormal current, the common collector-to-emitter voltage $V_{CE}$ increases to thereby charge capacitor C1 of the RC integrator through resistance R7 at a rate dependent upon the magnitude of $V_{CE}$. The time values $t_{RC}$ in the last column of the above table show the time intervals in microseconds required for the voltage across capacitor C1 of the RC integrator to reach the threshold voltage (1.62 volts) starting from zero volts for the corresponding $V_{CE}$ values in the first column of the table. Assume that after a time interval $t_{RC}$ capacitor C1 is charged to a voltage which exceeds the threshold (1.62 volts) voltage applied to the noninverting input of comparator COMP 1, thereby flipping the output of COMP 1 negative (binary 0). The binary 0 output from COMP 1 causes diode D1 to conduct and open logic gate NAND 1 so its output becomes positive (binary 1) as the result of the positive binary 1 voltage applied to the noninverting input of NAND 1 derived from a voltage divider comprising resistances R8 and R9 connected in series between the voltage source + and ground. The collector of predriver transistor PRD is coupled through a resistance R10 to the base of driver transistor Q2 connected in a Darlington arrangement with the paralleled power transistors PS1-PS7, and the binary 1 output from gate NAND 1 turns off predriver transistor PRD to thereby remove the base drive current pulse from the power switch PS. The binary 1 voltage output from NAND 1 is also coupled to the B input on pin 11 of a 233 microsecond monostable "inhibit" multivibrator MONO 2 but does not trigger it to the unstable state for the reason that it is only triggered on 1 to 0 negative-going transitions.

The selectively variable width pulses from control PWM are applied through an input delay resistor-capacitor network DN to two-microsecond, edge-triggered monostable multivibrator MONO 1 so that the multivibrator is turned on after a two microsecond delay subsequent to the leading edge of the PWM pulse. Delay network DN verifies that a PWM pulse is an input for a fixed interval before timing is initiated by the monostable MONO 1. Network DN includes a comparator COMP 2 whose noninverting input receives a fixed binary 1 positive voltage derived at the junction of two resistances R13 and R14 connected in series as a voltage divider between voltage source + and ground so that the output of COMP 2 in the interim between PWM pulses is positive (binary 1) and is applied to the B trigger input (pin 5) of MONO 1. Each pulse from control PWM charges a capacitor C2 of the delay network DN through two series resistances R15 and R16. One electrode of capacitor C2 is grounded and its other electrode is coupled to the inverting input of comparator COMP 2. After a two microsecond delay subsequent to the leading edge of each PWM pulse capacitor C2 is charged to a sufficiently high voltage to flip the output of COMP 2 to binary 0 voltage which is applied to the B trigger input (pin 5) of the two microsecond multivibrator MONO 1. Multivibrators MONO 1 and MONO 2 may both be incorporated in a Motorala 14528 device and are of the edge-triggered type, and the negative-going transition applied to the B trigger input of MONO 1 turns it on so that it changes: (1) its Q output on pin 6 to binary 1 to turn on a capacitor-discharging transistor CDT and (2) its $\overline{Q}$ output on pin 7 to binary 0. The collector of transistor CDT is coupled to capacitor C1 of the RC integrator, and conduction by transistor CDT discharges capacitor C1 so that the timing intervals $t_{RC}$ provided by the RC integrator always begin from zero adjacent the leading edge of each pulse from control PWM. The binary 0 appearing on the $\overline{Q}$ output from the two microsecond monostable multivibrator MONO 1 when this multivibrator is turned on at the end of the two microsecond delay is coupled through diode D2 to the inverting input of logic gate NAND 1 to hold the output thereof at binary 1 voltage and thus maintain predriver transistor PRD off.

Comparator COMP 2 squares the edges of the PWM control pulses and also inverts the polarity thereof, and the output of COMP 2 is coupled to the inverting input of a comparator COMP 3 which "re-inverts" each PWM control pulse before it is coupled through diode D3 to the inverting input of logic gate amplifier NAND 1. When the output of COMP 2 goes to binary 0 voltage at the end of the two microsecond delay provided by network DN, the output of COMP 3 goes to binary 1 voltage so it does not affect logic gate NAND 1, and the output of NAND 1 is controlled by the $\overline{Q}$ output (binary 0) of the two microsecond multivibrator MONO 1. Multivibrator MONO 1 turns off after its period and changes: (1) its Q output to binary 0 to thereby turn off capacitor-discharging transistor CDT, and (2) its $\overline{Q}$ output to binary 1 voltage. When the $\overline{Q}$ output of MONO 1 goes to binary 1 voltage, the voltage source + coupled through resistance R5 to the inverting input of logic gate NAND 1 changes its output to binary 0 voltage and therey turns on predriver transistor PRD and also turns on power switch PS.

The output from NAND 1 is also coupled to the B trigger input (pin 11) of 233 microsecond "inhibit" monostable multivibrator MONO 2, and such 1 to 0 transition applied to its B input triggers MONO 2 to the unstable state so that it provides binary 0 voltage on its Q output which is coupled to the A trigger input (pin 4) of MONO 1, thereby locking out the two microsecond multivibrator MONO 1 during the 233 microsecond period to inhibit high frequency conduction limit mode oscillations.

In order to trigger MONO 2, a low voltage must exist on its A input and a negative-going transition must be applied to its B input. When high voltage $V_{CE}$ across power switch PS triggers comparator COMP 1 into the conduction limit mode, the binary 0 output from COMP 1 is applied through diode D1 to the inverting input of NAND 1 whose output goes to binary 1, but such 0 to 1 positive-going transition does not affect MONO 2 which is only triggered by negative-going voltage transitions. Inasmuch as the period of MONO 2 is 233 microseconds and MONO 1 is locked out during this interval, repeated high frequency conduction limit modes of power switch PS are prevented which might otherwise cause too high switching losses and destroy power switch PS.

The safe operating area characteristics of power switch PS shown in the above table change with temperature, and a temperature dependent resistor TDR connected in shunt to a capacitor C4 between the junction of R3 and R4 and ground is subjected to the temperature of the power switch heatsink and provides selective change of the conduction limit characteristic with temperature. Variations in the resistance of TDR with temperature change the threshold voltage for comparator COMP 1 derived at the junction of R3 and R4 in a direction to change the $t_{RC}$ value of the integrator circuit to that which corresponds to the voltage, current and temperature values at which the power switch is being operated.

Figure 3:
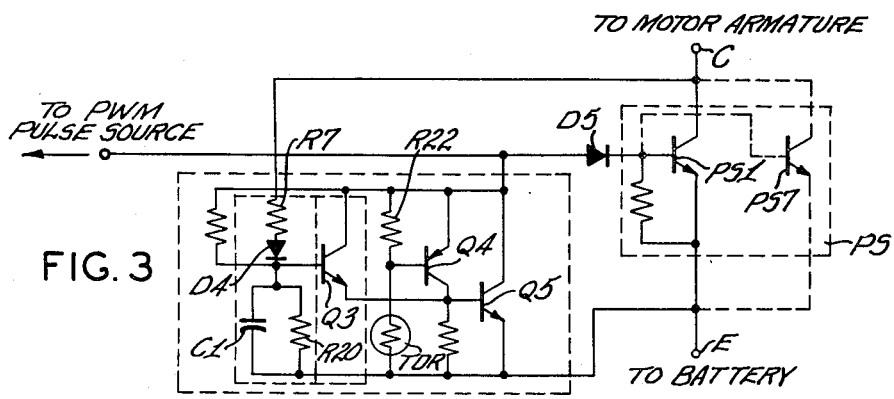
FIG. 3 shows a simplified embodiment of the invention wherein the threshold "triggering" potential is established by the voltage drop across the diode junction of a transistor.

FIG. 3 illustrates an alternative embodiment of the invention which is simplified in comparison to the FIG. 1 circuit and can be plugged into, and provide the conduction limit protection of the invention for, existing power transistor switches. FIG. 3 does not show the PWM pulse source and the motor which were illustrated in FIG. 1, and the FIG. 3 embodiment eliminates the two multivibrators, the input pulse delay network, the predriver and driver transistors, and the two microsecond time interval for discharging the capacitor C1 of the integrator as utilized in the FIG. 1 embodiment.

The collector-to-emitter voltage $V_{CE}$ of power switch PS is applied to an RC integrator network comprising resistance R7, a diode D4 and capacitor C1 which is in shunt with a resistance R20. The voltage across capacitor C1 of the integrator is applied to a threshold voltage detector, or comparator comprising the base-emitter junction of a transistor Q3 in series with the base-emitter junction of a base current drain transistor Q5. Comparator transistor Q3 compares the voltage across capacitor C1 with a relatively fixed voltage established by the voltage drop across the base-emitter junction of Q3 in series with the voltage drop across the base-emitter junction of transistor Q5 whose collector-to-emitter path is in shunt to the series combination of the base-to-emitter junction of power switch PS and diode D5.

The base drive current source (not shown) of selectively variable width (PWM) pulses for the power switch is preferably of the type having relatively low impedance during the off period between (PWM) pulses such as the constant current switching regulator disclosed in U.S. Pat. No. 3,803,471 in which I am joint patentee with R. G. Price and D. L. Moore, having the same assignee as this invention, and such base drive source during the on period supplies PWM pulses of sufficient amplitude through a diode D5 to the base of power transistor PS to saturate transistors PS1-PS7. Capacitor C1 discharges in the off period between PWM pulses through resistance R20 and also through the base-collector junction of Q3 in series with the low impedance of the PWM pulse source. Transistor Q5 provides a shunt path to the power switch PS to permit removal of base current from the power switch. During the on period, the PWM pulse source provides base drive current of sufficient magnitude to saturate PS, and the base of Q3 assumes a potential of approximately 0.6 volts relative to ground because of the voltage drop across its base-emitter junction. However, this 0.6 volt potential is not high enough to turn on the base-to-emitter junctions of transistors Q3 and Q5 in series. Consequently power transistor PS will turn on adjacent the leading edge of a PWM pulse because Q3 and Q5 will not turn on. Capacitor C1 of the integrator charges through resistance R7 from $V_{CE}$ across power switch PS, so power switch PS must saturate before C1 charges up to a voltage equal to the voltage drops across the base-emitter junctions of Q3 and Q5 in series since, if it does not, Q3 and Q5 will turn on and base current will be drained away from power switch PS through the emitter-collector path of Q5. If this occurs and base current is removed from power switch PS, its $V_{CE}$ will increase rapidly and thereby charge C1 more rapidly in a boot strap operation until Q5 drains away substantially all the base drive current from power switch PS.

A temperature protection transistor Q4 has its emitter and collector connected respectively to the collector and base of Q5 and has its base connected to a voltage divider comprising a resistance R22 and a negative temperature coefficient resistor TDR connected in series across the collector-emitter path of Q5. When the temperature of the power switch heatsink increases, the resistance of TDR decreases to provide base drive to Q4 which then increases its collector current flowing into the base of Q5 to change the threshold voltage level at which comparator transistor Q3 operates in a direction to maintain power switch PS within its safe operating area.

It will be appreciated that the FIG. 1 embodiment can approach 100 percent modulation since the capacitor C1 of the RC integrator in this embodiment is not discharged in the off-time between PWM pulses in the manner of the FIG. 3 embodiment.

Figure 4:
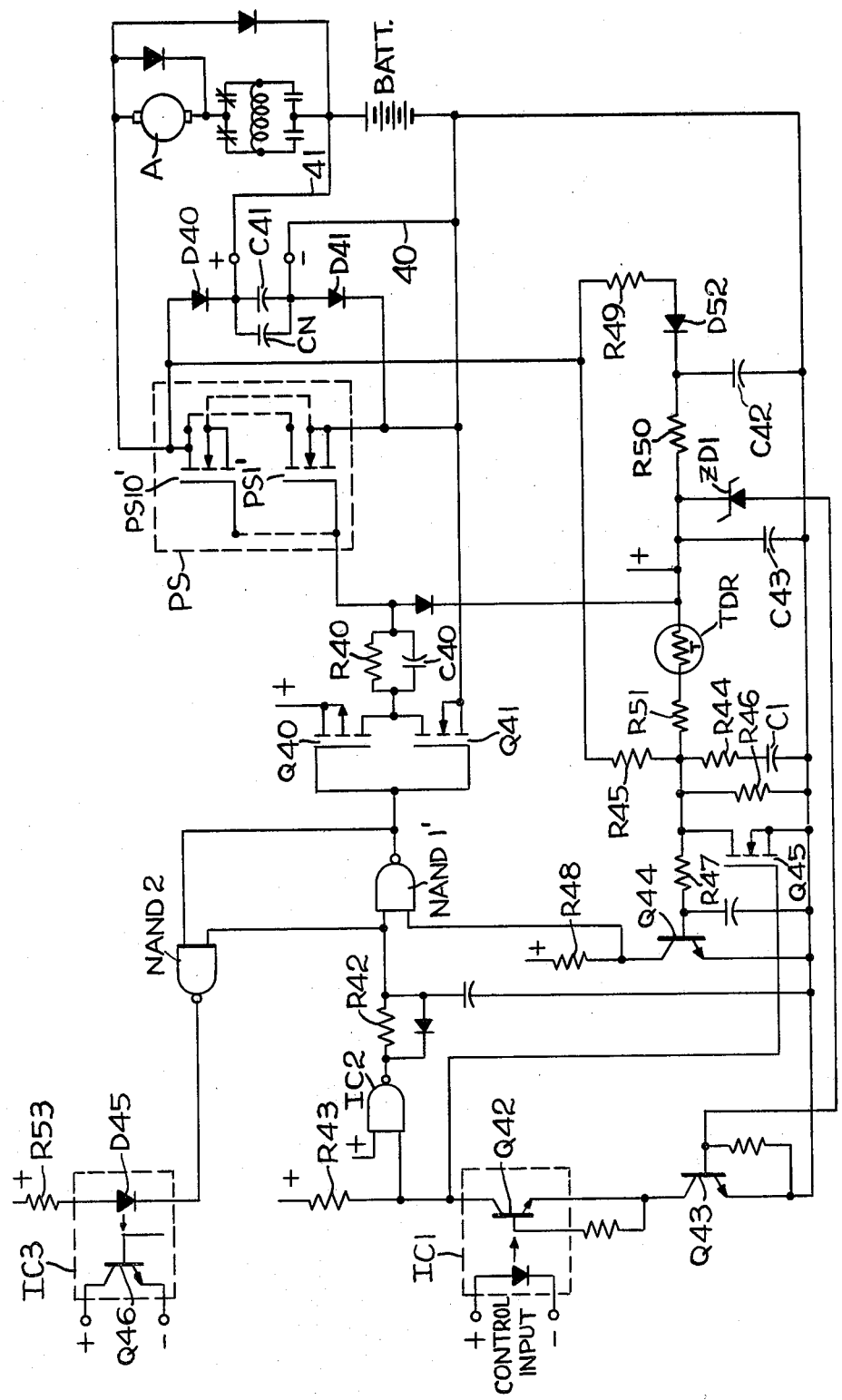
FIG. 4 illustrates a field effect transistor power switch embodiment of the invention.

FIG. 4 illustrates a high current power switch embodiment of the invention with built-in overcurrent and overtemperature protection and which provides extremely fast switching that minimizes the switching losses of the power switch. Switching time in this power switch embodiment does not change with temperature, and the power switch can be directly driven by complementary metal-oxide semiconductor (CMOS) logic and with no requirement for an external power supply. In the FIG. 4 embodiment power switch PS comprises a plurality of paralleled power field effect transistors PS1′–PS10′ with their source ohmic contacts, or electrodes commoned and connected to the negative terminal of battery BATT, their drain electrodes commoned and connected to one side of motor armature A, and their gate electrodes also commoned. Each power field effect transistor (FET) PS1′–PS10′ exhibits a gate capacitance of approximately 2000 picofarads which must be charged and discharged quickly in order to obtain rapid switching. This is accomplished by having a stiff drive provided by two driver FETs Q40 and Q41 connected in push-pull and coupled to the commoned gate electrodes of power FETs PS1′–PS10′ through an RC circuit comprising a resistance R40 in parallel with a capacitor C40. Because of the extremely fast switching speed and lack of second breakdown of the power FETs, no path shaping circuit is required, and the switching losses of power switch PS are minimal. Further, the switching time does not change with temperature. A capacitive clamp is provided because of the necessity to discharge series inductance during the fast turn-off of the power FETs and preferably comprises a plurality of paralleled clamp capacitors C41-C$_n$ connected in series with two diodes D40 and D41 across the commoned source and commoned drain electrodes of FETs PS1′–PS10′. The capacitive clamp is illustrated as being constructed so the power switch module PS can be used with either the commoned source electrodes connected to the cathode of battery BATT or the commoned drain electrodes connected to the anode of battery BATT (not shown). As shown in the drawing with the source electrodes connected to the negative polarity of battery BATT, diode D41 is short circuited with a jumper 40 from the − clamp terminal to the cathode of battery BATT, and the + clamp terminal is connected by a jumper 41 to the anode of battery BATT for discharge purposes.

The gate electrodes of gate driver FETs Q40 and Q41 are commoned and connected to the output of a complementary metal-oxide-semiconductor (CMOS) gate NAND 1′ which transmits the input control pulses for turning power switch PS on and off only if the protective conduction limit circuit described hereinafter senses normal conditions. The input control pulses for turning power switch PS on and off are coupled to one input of gate NAND 1′ through an optical-isolator circuit IC1, an inverter gate IC2, and a resistance R42. Optical-isolator integrated circuit IC1 may include a photo-sensitive transistor Q42 whose base is receptive to light signals, whose collector is connected to the input of inverter gate IC2 and through a resistance R43 to the internal power supply designated +, and whose emitter is connected to the collector of a voltage monitor transistor Q43 which is normally turned on, as described hereinafter.

The conduction limit protective circuit includes an RC timing circuit integrator having a capacitor C1 in series with two resistances R44 and R45 connected between the commoned drain electrodes of power FETs PS1′–PS10′ and the negative side of internal power supply +. This RC timing circuit senses the voltage drop across power FETs PS1′–PS10′ and also senses the temperature of the heatsink for said power FETs. Such conduction limit circuit also includes a resistance R46 having one end connected to the negative side of the internal power supply + and its other end connected to the junction between R44 and R45 and also connected through a resistance R47 to the base of a conduction limit control, or threshold voltage detector transistor Q44. The collector of Q44 is coupled through a resistance R48 to the internal power supply +, and the emitter of Q44 is connected to the negative side of the internal power supply. When conduction limit control transistor Q44 is turned on, binary 0 voltage is coupled to an input of gate NAND 1′ so that its output goes to binary 1 to thereby turn off driver FET Q40 and turn on driver FET Q41 and thus remove positive control pulses from power switch PS.

The conduction limit protection circuit shown in FIG. 4 integrates the voltage drop across power switch PS comprising paralleled power FETs PS1′–PS10′ and is operated to turn off power switch PS, if such voltage drop becomes abnormally high, after a time interval that is a function of the magnitude of such voltage drop in an arrangement wherein the power FETs are maintained within their safe operating area limits at all times and such safe operating area limits are changed in accordance with the voltage, current and temperature conditions to which power switch PS is subjected. RC timing circuit C1, R44, R45 integrates the voltage drop across the source-drain ohmic contacts of FETs PS1′–PS10′ so that voltage builds up to a predetermined magnitude across timing capacitor C1 after a time interval which is a function of the magnitude of such voltage drop. The voltage across resistance R46 is coupled through resistance R47 to the base of conduction limit control transistor Q44 and turns Q44 on if such voltage exceeds the base-emitter threshold of Q44.

When the voltage drop across power switch PS becomes very high, the voltage across R46 immediately becomes high to turn on conduction limit control transistor Q44 and thereby operate gate NAND 1' to remove control pulses from the power FETs PS1'–PS10'. Smaller voltage drops across power FETs PS1'–PS10' do not immediately result in a voltage across R46 which exceeds the base emitter threshold of Q44, and Q44 is only turned on after a time interval required to charge timing capacitor C1 until the voltage at the junction of R44 and R45 exceeds the base-emitter threshold of Q44.

The source and drain electrodes of a conduction limit defeat FET Q45 are connected respectively to the negative side of the internal power supply and to the junction between R44 and R45, and the gate of Q45 is connected to the collector of photosensitive transistor Q42. The absence of an input control pulse causes a logic 1 voltage at the gate of Q45 and thereby turns Q45 on to initiate discharge of capacitor C1. Each input control pulse turns on Q42 to apply logic 0 voltage to the gate of Q45 to thereby turn Q45 off and so that charging of timing capacitor C1 begins from zero volts. Complete discharge of C1 only occurs if Q45 conducts over a period of time, and C-1 functions as an integrating memory which accumulates information regarding previous conduction limit modes and shortens the charging time to thereby inhibit conduction limit mode oscillations, in a manner analogous to the 233 microsecond multivibrator of the FIG. 1 embodiment.

The power requirements for the disclosed conduction limit control circuit are so low that the internal power supply + therefor may be derived from the voltage across power switch PS comprising FETs PS1'–PS10' during its off time. The series arrangement of a capacitor C42, a diode D42 and a resistance R49 is connected between the cathode of battery BATT and the commoned drain ohmic contacts of FETs PS1'–PS10'. Capacitor C42 is charged through resistance R49 and diode D42 during the off-time of FETs PS1'–PS10'. One terminal of a zener diode ZD1 is connected through a resistance R50 to the junction between C42 and D42, and the other terminal of ZD1 is connected to the base of voltage monitor transistor Q43 whose emitter is coupled to the cathode of battery BATT. One electrode of a power supply capacitor C43 is connected to the junction between ZD1 and resistance R50 and its other electrode is connected to the cathode of battery BATT so that the internal power supply voltage builds up across C43 and is designated + in FIG. 4, and the potential thereof is regulated by zener diode ZD1 which also monitors the presence of adequate charge on capacitor C42. The voltage across ZD1 is coupled to the base of voltage monitor transistor Q43 and maintains Q43 in conduction. In the event that FETs PS1'–PS10' remain conducting for a long period of time such as one second, capacitor C42 will discharge to a point where the current flow through ZD1 is no longer sufficient to hold voltage monitor transistor Q43 in conduction and it will turn off, thereby removing input control pulses from power switch FETs PS1'–PS10'. This will turn off power switch PS momentarily to recharge capacitor C42. When C42 is recharged, current flow through ZD1 will increase and result in turning on transistors Q43 and Q42 so that input control pulses are again supplied to power switch PS.

A nonlinear negative temperature coefficient resistor TDR is connected in series with a resistance R51 between the internal power supply + and the junction between R44 and R45 and is responsive to the temperature of the heatsink for power FETs PS1'–PS10'. When the temperature of the heatsink approaches 75 degrees C., the resistance of TDR decreases significantly so that timing capacitor C1 is partially charged from the internal power supply + through R51, thereby decreasing the magnitude of voltage drop across power switch PS required to turn on conduction limit control transistor Q44 to remove input control pulses from power switch PS.

A logic gate NAND 2 having its inputs connected across one input and the output of gate NAND 1' provides a feedback signal indicating whether power switch PS is following the control input signals. The output of gate NAND 2 is coupled to the internal power supply + through a resistance R53 and a light emitting diode D45 of a feedback signal optical isolator integrated circuit IC3. When an input control pulse is present and power switch PS is following such pulse, gate NAND 1' sees logic 1 on both inputs and provides logic 0 output with the result that gate NAND 2 provides a logic 1 output, current does not flow through light emitting diode D45, and photosensitive transistor Q46 of IC3 is turned off. Gate NAND 2 and photoisolator IC3 provide the same output when no control input signal is present since gate NAND 2 still has logic 1 and logic 0 signals on its inputs. However, when the conduction limit circuit has operated, in response to abnormally high voltage drop across power switch PS, to turn on conduction limit control transistor Q44, the output of gate NAND 1' goes to logic 1, the output of gate NAND 2 goes to logic 0 when an input control pulse is present, diode D45 conducts current, and photosensitive transistor Q46 of IC3 turns on.

The embodiments of the invention in which an exclusive property or privilege is claimed are defined as follows:

1. A conduction limit protective arrangement for a power transistor switch regulated by a succession of control pulses which changes the conduction limit as a function of switch operating conditions and permits it to carry maximum current while being fully protected at all times comprising, in combination, RC integrator means including a timing capacitor in series with a resistance connected across said power transistor switch for charging said timing capacitor with the voltage from across said power transistor switch through said resistance during said control pulses to derive a potential which increases in magnitude as a function of the time integral of said voltage across said power switch, a comparator for comparing said potential to a threshold voltage and for providing an output signal when the former becomes equal to the latter, means for discharging said timing capacitor to a predetermined voltage after the termination of each said control pulse, and means responsive to said output signal from said comparator for removing said control pulses from said power transistor switch, whereby, if said power transistor switch experiences high on-voltages, it is turned off after a time interval which is a function of the time integral of the voltage drop thereacross.

2. In the conduction limit protective arrangement of claim 1 wherein said comparator compares the voltage across said timing capacitor to said threshold voltage.

3. In the conduction limit protective arrangement of claim 1 wherein said RC integrator means includes said timing capacitor in series with first and second resistances, and said comparator compares the voltage across the serial arrangement of said second resistance and said timing capacitor to said threshold voltage, whereby said comparator immediately provides said output signal to remove said control pulses in response to abnormally high on-voltage experienced by said power transistor switch.

4. In the combination of claim 1, 2 or 3 wherein said power transistor switch comprises a plurality of paralleled power transistors.

5. In the combination of claim 4 wherein said paralleled transistors normally operate in saturation, and said comparator provides said output signal when said transistors come out of saturation and move into the active region.

6. In the combination of claim 4 wherein said parallel transistors are in a Darlington arrangement with a driver transistor which normally operates in saturation and said comparator provides said output signal when said power transistors experience sufficiently high on voltage to cause said driver transistor to come out of saturation and move into the active region.

7. In the conduction limit protective arrangement of claim 4 wherein said power transistor switch comprises a plurality of paralleled power field effect transistors having their source electrodes commoned, their drain electrodes commoned and their gate electrodes commoned.

8. In the combination of claim 1, 2 or 3 wherein said comparator includes a transistor and said threshold voltage includes the potential drop across the base-to-emitter junction of said transistor.

9. In the combination of claim 4 wherein said comparator includes a transistor and said threshold voltage includes the potential drop across the base-emitter junction of said comparator transistor.

10. In the combination of claim 1, 2 or 3 and including thermally dependent resistance means for varying said threshold voltage as a function of the temperature of said power switch in a direction to decrease said threshold voltage as the temperature of said power switch increases.

11. In the combination of claim 1, 2 or 3 wherein said means for discharging said timing capacitor is responsive to the leading edge of each control pulse.

12. In the combination of claim 1, 2 or 3 wherein said timing capacitor discharging means initiates discharge of said timing capacitor adjacent the trailing edge of each control pulse.

13. In the combination of claim 12 wherein said control pulses are provided by a pulse source which has a relatively low impedance in the interval between pulses and said means for discharging said capacitor includes said pulse source.

14. In the combination of claim 4 wherein the collector-emitter path of a base current drain transistor is in shunt to the base-emitter path of said power switch and said means for removing said control pulses from said power switch turns on said base current drain transistor.

15. In the combination of claim 14 wherein the collector-emitter path of said base current drain transistor is in shunt to the series arrangement of a diode and the base-emitter path of said power switch.

16. A conduction limit protective arrangement for a power transistor switch regulated by a succession of control pulses which changes the conduction limit as a function of switch operating conditions comprising, in combination, an RC integrator circuit including a timing capacitor in series with a resistance connected across said power transistor switch so that said timing capacitor is charged with the voltage from across said power transistor switch through said resistance during said control pulses to a voltage which is the time integral of the voltage across said power transistor switch, a comparator for comparing said voltage across said timing capacitor to a threshold voltage and for providing an output signal when the former becomes equal to the latter, means for discharging said timing capacitor to a predetermined voltage after the termination of each control pulse, and means responsive to said output signal from said comparator for removing said control pulses from said power transistor switch, whereby, if said power transistor switch experiences high on-voltages, it is turned off after a time interval which is a function of the time integral of the voltage drop thereacross.

17. A conduction limit protective arrangement for a power transistor switch regulated by a succession of control pulses which changes the conduction limit as a function of switch operating conditions and permits it to carry maximum current while being fully protected at all times comprising, in combination, an RC integrator circuit including the serial arrangement of a first resistance, a second resistance, and a timing capacitor connected across said power transistor switch so that said timing capacitor is charged with the voltage from across said power transistor switch through said first resistance and said second resistance during said control pulses, a comparator for comparing the voltage across the serial arrangement of said timing capacitor and said second resistance to a threshold voltage and for providing an output signal when the former becomes equal to the latter, means for discharging said timing capacitor to a predetermined voltage after the termination of each said control pulse, and means responsive to said output signal from said comparator for removing said control pulses from said power transistor switch, whereby, if said power transistor switch experiences high on-voltages, it is turned off after a time interval which is a function of the time integral of the voltage drop thereacross and it is turned off immediately if said on-voltages are abnormally high.

18. In the conduction limit protection arrangement of claim 17 additionally having means for charging said timing capacitor through the serial arrangement of a thermally dependent resistance (TDR FIG. 4) and said second resistance (R44), and wherein said thermally dependent resistance is responsive to the temperature of the heatsink for said power switch and decreases significantly in impedance when said heatsink temperature approaches predetermined magnitude.

19. A conduction limit protective arrangement for a power transistor switch regulated by a succession of control pulses which changes the conduction limit as a function of switch operating conditions and permits it to carry maximum current while being fully protected at all times comprising, in combination, RC integrator means including a timing capacitor in series with a resistance connected across said power transistor switch for charging said timing capacitor with the voltage from across said power transistor switch through said resistance during said control pulses to derive a potential which increases in magnitude as a function of the time integral of said voltage across said power switch, a comparator for comparing said potential to a threshold voltage and for providing an output signal when the former becomes equal to the latter, means for discharging said timing capacitor to a predetermined voltage after the termination of each said control pulse, means responsive to said output signal from said comparator for removing said control pulses from said power transistor switch, whereby, if said power transistor switch experiences high on-voltages, it is turned off after a time interval which is a function of the magnitude of the voltage drop thereacross, a first monostable multivibrator (MONO 1) which is triggered adjacent the leading edge of each said control pulse, and wherein said timing capacitor discharge means (CDT) is actuated when said first multivibrator is triggered, and a second monostable multivibrator (MONO 2) having a longer period than said first multivibrator which is triggered at the end of the period of the first multivibrator and locks out the first multivibrator, and means (NAND 1, D2) for turning said power transistor switch off when said first multivibrator is triggered and for turning it on at the end of the period of said first multivibrator, whereby high frequency conduction limit mode oscillations are prevented.

20. A conduction limit protection arrangement for a power transistor switch (PS1-PS7 FIG. 3) regulated by a succession of control pulses and which changes the conduction limit as a function of switch operating conditions comprising, in combination, an RC integrator circuit including a timing resistance (R7) in series with a timing capacitor (C1) connected across said power transistor switch so that said timing capacitor is charged with the voltage from across said power transistor switch through said timing resistance during said control pulses to a voltage which is the time integral of the voltage across said power switch, means for discharging said timing capacitor (C1) to a predetermined voltage after the termination of each control pulse, a base current drain transistor (Q5) having its emitter-collector path in shunt to the base-emitter junction of said power switch, and means including a comparator transistor (Q3) having its base-emitter junction connected in series with the base-emitter junction of said base current drain transistor for comparing the voltage across said timing capacitor to a threshold voltage established by said series arrangement of the base-emitter junctions of said comparator and base current drain transistors, whereby said comparator and base current drain transistors will turn on, if said power switch comes out of saturation, after a time interval which is a function of the time integral of the voltage drop across the power switch.

21. A conduction limit control arrangement in accordance with claim 20 wherein the collector of said comparator transistor (Q3) is connected to the control pulse source and said means for discharging said timing capacitor (C1) includes said control pulse source and a resistance (R20) in shunt to said timing capacitor (C1).

* * * * *